(12) United States Patent
Pagani

(10) Patent No.: US 8,643,395 B2
(45) Date of Patent: Feb. 4, 2014

(54) CROSSTALK SUPPRESSION IN WIRELESS TESTING OF SEMICONDUCTOR DEVICES

(75) Inventor: Alberto Pagani, Nova Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/006,942

(22) Filed: Jan. 14, 2011

(65) Prior Publication Data

US 2011/0109342 A1 May 12, 2011

Related U.S. Application Data

(62) Division of application No. 12/037,319, filed on Feb. 26, 2008, now Pat. No. 7,915,908.

(30) Foreign Application Priority Data

Feb. 28, 2007 (IT) .............................. MI2007A0386

(51) Int. Cl.
G01R 31/02 (2006.01)
(52) U.S. Cl.
USPC ............ 324/754.31; 324/762.01; 324/762.03; 714/733

(58) Field of Classification Search
USPC ..................................................... 324/754.31
See application file for complete search history.

(56) References Cited

U.S. PATENT DOCUMENTS

| | | | |
|---|---|---|---|
| 4,649,569 A * | 3/1987 | Kennon et al. ............. | 455/67.11 |
| 4,859,990 A * | 8/1989 | Isaacman ................ | 340/539.19 |
| 6,161,205 A | 12/2000 | Tuttle | |
| 6,373,447 B1 * | 4/2002 | Rostoker et al. ............. | 343/895 |
| 6,759,863 B2 | 7/2004 | Moore | |
| 7,181,663 B2 * | 2/2007 | Hildebrant .................... | 714/726 |
| 7,202,687 B2 * | 4/2007 | Khandros et al. ........ | 324/754.03 |
| 7,257,504 B2 | 8/2007 | Bolander et al. | |
| 7,262,996 B2 | 8/2007 | Cheung | |
| 7,336,174 B1 | 2/2008 | Maloney | |
| 7,417,449 B1 | 8/2008 | Posey et al. | |
| 2005/0052282 A1 * | 3/2005 | Rodgers et al. ............ | 340/572.1 |
| 2005/0138499 A1 * | 6/2005 | Pileggi et al. ................ | 714/724 |
| 2006/0132167 A1 * | 6/2006 | Chen ............................ | 324/765 |
| 2006/0252375 A1 * | 11/2006 | Wu et al. .................... | 455/67.11 |

* cited by examiner

*Primary Examiner* — Richard Isla Rodas
(74) *Attorney, Agent, or Firm* — Wolf, Greenfield & Sacks, P.C.

(57) ABSTRACT

An integrated circuit integrated on a semiconductor material die and adapted to be at least partly tested wirelessly, wherein circuitry for setting a selected radio communication frequencies to be used for the wireless test of the integrated circuit are integrated on the semiconductor material die.

12 Claims, 4 Drawing Sheets

CROSSTALK SUPPRESSION IN WIRELESS TESTING OF SEMICONDUCTOR DEVICES

RELATED APPLICATIONS

This application is a division of prior application Ser. No. 12/037,319, filed on Feb. 26, 2008, entitled Crosstalk Suppression In Wireless Testing Of Semiconductor Devices which application claims the priority benefit of Italian Patent Application No. MI2007A000386, filed on Feb. 28, 2007, entitled Crosstalk Suppression In Wireless Testing Of Semiconductor Devices which applications are hereby incorporated by reference to the maximum extent allowable by law.

BACKGROUND OF THE INVENTION

1. Field of the Invention

The present invention relates to methods and systems for testing Integrated Circuits (ICs).

2. Discussion of the Related Art

ICs are typically manufactured many at a time in the form of dies on a semiconductor material wafer. After manufacturing, the semiconductor wafer is diced, so as to obtain a plurality of IC chips.

Before being shipped to the customers, and installed in various electronic systems, the ICs need to be tested to assess their functionality, and in particular ensuring that they are not defective. In particular, during the test, information regarding global or local physical faults (such as undesired presence of short circuits and break-down events) and more generally the operation of each die, can be detected (for example, by checking the waveform of one or more output signals of each die) so that only the dies that meet predetermined requirements, move to the subsequent manufacturing phases (such as lead bonding, packaging and final testing).

According to a known testing technique, the IC dies are tested before the semiconductor wafer is diced into the individual chips. The test conducted at the wafer level is referred to as "Wafer Sort".

For example, in case of non-volatile semiconductor memory devices (such as Flash memories) a test known as EWS (Electrical Wafer Sort) is performed on each die wherein the memory device is formed, in order to verify the correct operation thereof.

For performing the test, a tester is used which is coupled to the semiconductor wafer containing the dies to be tested, by means of a probe card which is used for interfacing the semiconductor wafer to the tester.

The tester is adapted to manage signals that are employed for performing the test. Hereinafter, such signals will be referred as test signals and include data signals which are generated by the tester and which are sent to each die to be tested by the probe card, and response signals which are generated by each die in response to the received data signals. The response signals are sent by each die to the tester, which processes them to derive an indication of the proper or improper operation of the die under test.

Often (for example during EWS), probes are employed wherein the electrical coupling of the probe card with the dies to be tested, necessary for achieving the signal exchange, is accomplished through a physical contact. For this purpose, the probe card consists of a PCB (Printed Circuit Board), which is connected to a large number (of the order of some thousands) of mechanical probes, which are adapted to physically contact input/output contact pads of each die to be tested.

However, this type of test system has several limitations; for example, there is the risk of damaging the contact pads of the die under test; also, it has a reduced parallel testing capacity: indeed, when more dies have been tested at the same time, the number of mechanical probes significantly increases, and it may happen that the electrical contacts between the pads and the mechanical probes are not good and electrical discontinuities may take place.

Moreover, when the contact pads are very close to each other, it is very difficult to ensure a good physical contact of the mechanical probes with the pads. Such problem is emphasized when the pads have are small in size and/or a large number thereof is present on each die.

In addition, the mechanical probes are very expensive, and this negatively contributes to the increase of the overall cost of the test system, and eventually of the ICs.

In an alternative, the test signals are, fully or at least in part wirelessly exchanged between the probe card and the dies to be tested, through wireless circuits embedded in the probe card. Typically, each testing site of the wireless probe card comprises at least one transceiver circuit and one or more micro-antennas which are able to communicate with the die through wireless communication, at radio frequency, with corresponding micro-antennas and transceiver circuits integrated on the dies, so as to establish a wireless bi-directional link between the tester and the die under test. In such a way, a wireless test is performed, and the mechanical probes are, fully or in part, eliminated.

A drawback of this solution is that when two or more dies are tested at the same time, there is a cross-talk between the test signals corresponding to different dies. This problem is particularly felt when the dies which have to be tested at the same time are close to each other, possibly adjacent.

In order to avoid cross-talk phenomena, the dies of the semiconductor wafer have to be tested one at a time, but this significantly increases the overall testing time.

SUMMARY OF THE INVENTION

According to an embodiment of the present invention, different radio communication frequencies are used for simultaneous wireless testing of two or more dies.

Particularly, the present invention provides a solution as set out in the independent claims.

Advantageous embodiments of the invention are provided in the dependent claims.

In detail, an aspect of the present invention provides an integrated circuit integrated on a semiconductor material die and adapted to be at least partially tested wirelessly, wherein means for setting at least a selected radio communication frequency to be used for the wireless test of the integrated circuit are integrated on the semiconductor material die.

BRIEF DESCRIPTION OF THE DRAWINGS

These and other features, and advantages of the present invention will be made apparent by the following detailed description of an embodiment thereof, provided merely by way of non-limitative example, description that will be conducted making reference to the attached drawings, wherein.

DETAILED DESCRIPTION

Figure 1:
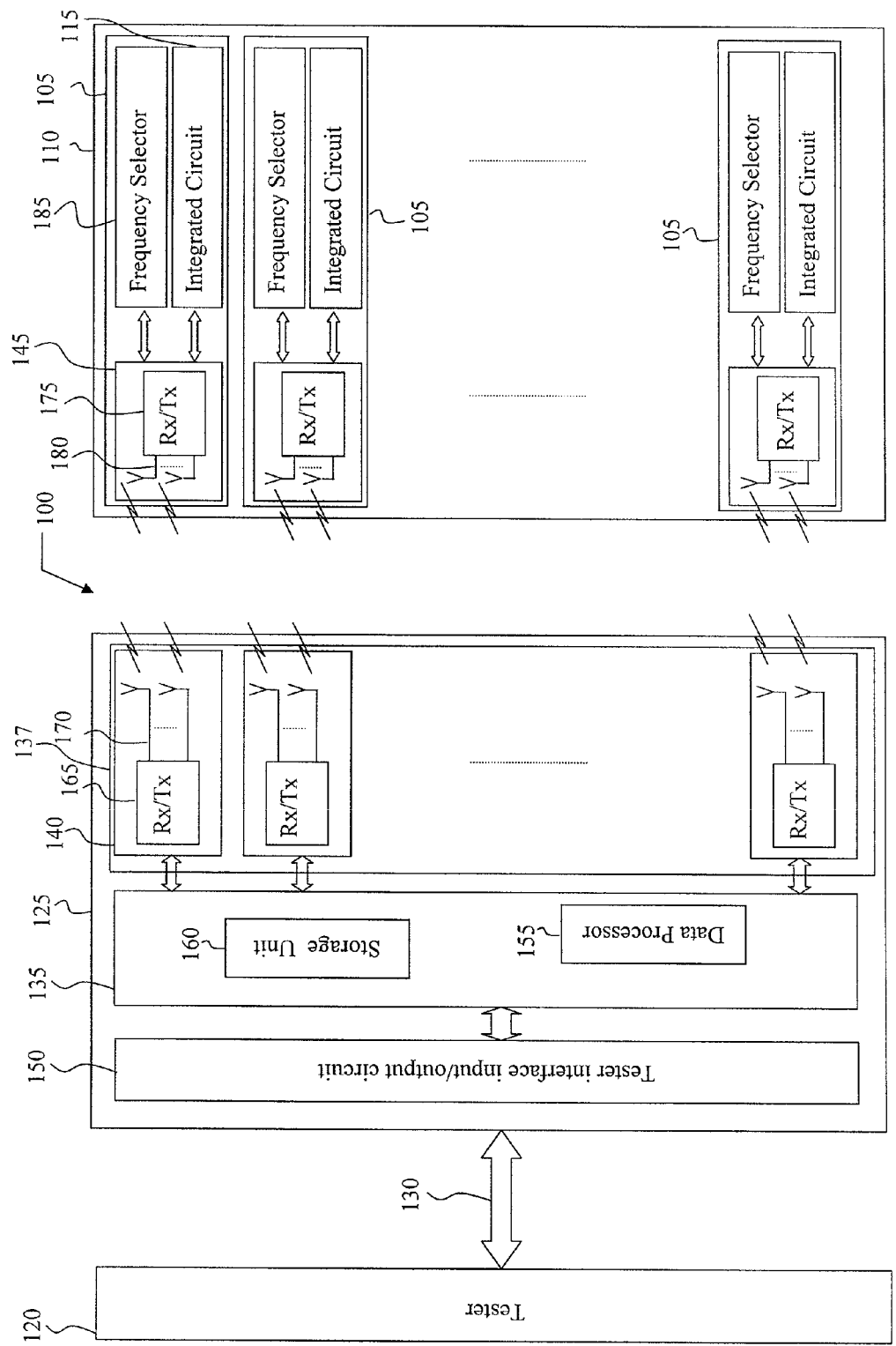
FIG. 1 schematically shows a block diagram of a test system according to an embodiment of the present invention.

Throughout the following description, identical or similar elements in the drawings are denoted by same reference numerals.

Referring to FIG. 1, a block diagram of a test system 100 according to an embodiment of the present invention is schematically shown. The test system 100 is adapted to wirelessly testing a plurality (for example, hundreds) of IC dies 105 belonging to a semiconductor wafer 110.

The specific type of IC 115 integrated on the dies 105 is not a limitation of the present invention; in particular, and merely by way of example, the ICs 115 may be or include memory devices, microprocessors or microcontrollers, digital logic circuits, Application Specific Integrated Circuits (ASICs).

For testing the dies 105 in order to assess their functionality, the test system 100 comprises a tester 120, which is adapted to generate test signals to be fed to the ICs 115 integrated on the dies 105; the tester 120 is coupled to a wireless probe card 125, which is adapted to be fed by the tester 120 (through wireline and/or wireless electrical signal distribution means 130 (which may be or include electrical cables, conductive lines or tracks, a radio link or an optical link) with the test signals, and the power supply necessary for its operation; the wireless probe card 125 is employed for interfacing the tester 120 with each die 105 on the wafer 110.

The wireless probe card 125 comprises a control circuit 135 adapted to manage the test signals exchanged with the tester 120, and a testing section 137 comprising a plurality of wireless units 140, each of which is adapted to wirelessly communication with a corresponding wireless communication unit 145 provided in each die 105. In other words, each of the wireless units 140 of the testing section 137 of the wireless probe card 125 is adapted to establish a one-to-one communication relationship with a corresponding wireless communication unit 145 provided on one of the dies 105 of the semiconductor wafer 110 to be tested. It is pointed out that in some embodiments of the invention, the plurality 137 of wireless units 140 of the wireless probe card 125 may include a number of wireless units 140 equal to the number of dies 105 of the wafer 110 to be tested (in which case, all the dies of the wafer can in principle be tested in parallel); however, in alternative embodiments of the invention, the number of wireless units 140 may be lower than the number of dies 105 of the wafer 110 (in which case, groups of dies of the wafer are tested in parallel), or the number of wireless units 140 may be even greater than the number of dies 105 of the specific wafer under testing (in which case, only a subset of the wireless units 140 are used for testing the whole wafer).

The tester 120 and the control circuit 135 of the wireless probe card 125 may communicate through a tester interface input/output circuit 150. The control circuit 135 comprises for example a data processor 155 which controls overall the operation of the wireless probe card 125, and which operates under the control of a software stored in a storage unit 160.

More in detail, each wireless unit 140 includes at least one transceiver circuit (or transponder) 165, which is coupled to at least one antenna 170.

Similarly, each wireless communication unit 145 on the die 105 includes at least one transceiver circuit (or transponder) 175, which is coupled to at least one micro-antenna 180. The transceiver circuits 165, with the associated antennas 170, and the transceiver circuits 175, with the micro-antennas 180, are adapted to establish a wireless bi-directional link between the wireless probe card 125 and each die 105 of the wafer under test 110.

The power supplies necessary for the operation of the ICs may also be wirelessly transferred to the dies 105 under test from the wireless probe card 125, or it is possible to use other methods, such as probes, to supply power to dies 105.

The generic transceiver circuit 165 encodes the test signals received from the tester 120 and transmits them to the generic transceiver circuit 175 on a die 105 using any suitable coding and radio frequency modulation scheme. Examples of radio frequency modulation schemes include Amplitude Modulation (AM), Frequency Modulation (FM), Pulse Code Modulation (PCM), phase modulation or any combination thereof. The specific coding and modulation scheme is not per-se imitative for the present invention.

Then, the transceiver circuit 175 receives, demodulates and decodes the test signals, and the test signals are then used to test the IC integrated on the die 105; response signals are generated in response to the test signals: the response signals are encoded, modulated and transmitted by the transceiver circuit 175 to the wireless probe card 125, where the transceiver circuit 165 performs a demodulation and decoding, and the response signals are then sent to the tester 120, which processes them to assess the functionality of the IC integrated on the die 105 under test.

According to an embodiment of the present invention, in order to test multiple dies in parallel without incurring in cross-talk problems, different radio communication frequencies are used by the wireless probe card 125 for communicating with the different dies 105 to be tested in parallel.

To this purpose, in an embodiment of the present invention, integrated in the generic die 105 is a radio frequency selector 185, which determines the generic radio frequency to be used by the wireless communication unit 145 integrated on the die to communicate with the wireless probe card 125. In particular, the radio frequency selector 185 is operatively coupled to the transceiver circuit 175, which sets the generic radio communication frequency according to the indications provided by the radio frequency selector 185. In this way, the transceiver circuit 175 is tuned on the same frequency used by the corresponding wireless unit 140.

The radio frequency selectors 185 integrated on each die 105 allow setting different radio communication frequencies for each die 105 to be tested in parallel with other dies of the wafer 110. In such a way, two or more, possibly all the dies 105 of the semiconductor wafer 110 can be tested at the same time so avoiding cross talk among the test signals.

Alternatively, it may be provided that only adjacent dies 105 on the wafer 110 use differentiated radio communication frequencies. For example, a radio frequency pattern may be defined, according to which different radio communication frequencies are set for groups of two or more adjacent dies 105 on the wafer 110. The radio frequency selectors 185 integrated in the dies 105 follow the predefined pattern of radio frequencies on the semiconductor wafer 110.

Figure 2:
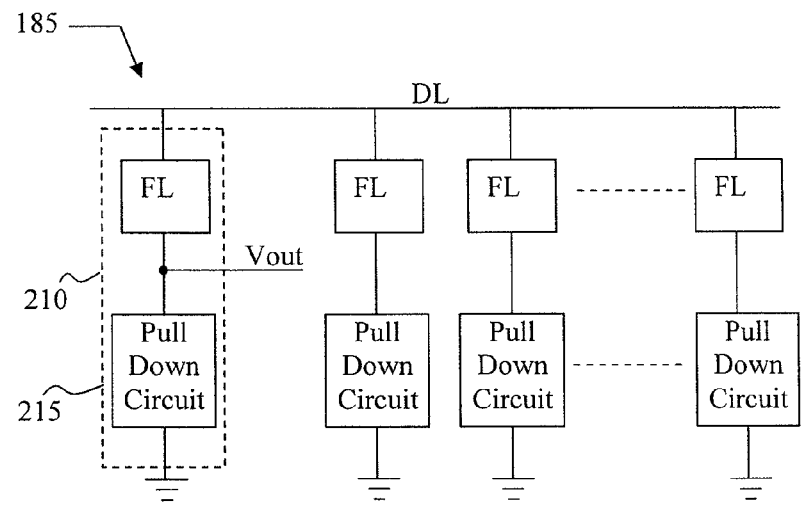
FIG. 2 schematically shows a communication frequency selector of FIG. 1, according to an embodiment of the present invention.

Referring to FIG. 2, an implementation of the radio frequency selector 185 of FIG. 1 is shown, using fuses to set the desired radio communication frequencies.

The radio frequency selector 185 comprises a circuit having a plurality of circuital branches 210, each of which is adapted to provide one bit of a binary code corresponding to the desired radio communication frequencies to be used by the corresponding die 105 for communicating with the wireless unit 140 of the wireless probe card 125. For this purpose, at least one programmable element, such as a fusible link FL, is provided in each circuital branch 210. The radio frequency selector 185 can be programmed by selectively burning the fusible links FL, so as to store in the radio frequency selectors 185 the binary codes corresponding to the selected radio communication frequencies.

In greater detail, in an embodiment of the present invention each fusible link FL has a first terminal connected to a power supply distribution line DL distributing the power supply, and a second terminal coupled to a first terminal of a respective pull-down circuit 215 (for example including one or more resistors or transistors, e.g. MOSFETs) which has the second terminal connected to a ground voltage distribution line. The second terminal of the fusible link FL provides an output voltage signal Vout whose value is indicative of the bit stored in the circuital branch 210. For example, the bit has a logic level "0" when the output voltage signal Vout reaches a low level (in the example at issue, ground), whereas the bit has a logic level "1" when the output voltage signal reaches a high level (in the example at issue, the power supply).

Before performing the test on the dies 105 of the semiconductor wafer 110, the radio communication frequencies of the different dies 105 are set by programming the radio frequency selector 185. In particular, considering the generic circuit branch 210 (similar considerations applies to the other circuit branches 210 of the radio frequency selector 185), after manufacturing of the wafer 110 the fusible link FL is conductive and the output voltage signal Vout reaches approximately the supply voltage (thus, the corresponding bit in the binary code is "1"). During the programming phase of the radio frequency selectors 185, the fusible link FL may be burned (for example, electrically, or using laser or other suitable methods), becoming (in this particular embodiment) essentially an open circuit, in which case the output voltage Vout reaches approximately the ground (thus, the corresponding bit in the binary code is "0").

By performing similar operations on the other circuit branches 210, the binary code corresponding to the desired radio communication frequencies is stored in the radio frequency selector 185.

On the side of the test equipment, the tester 120 sets the proper radio communication frequencies in transceiver circuits 165 of each wireless unit 140, so that each wireless unit 140 can wirelessly communicate with a wireless communication unit 145 integrated on a corresponding die 105 to be tested.

Afterward, the semiconductor wafer 110 is brought in close proximity (such as less than 100 μm) of the wireless probe card 125, so that the dies 105 are close to respective wireless units 140 which are integrated on the wireless probe card 125. The IC integrated on each die 105 is then tested based on test signals that are generated by the tester 120 and which are wirelessly exchanged by the wireless unit 145 and a corresponding wireless unit 140.

In response to the received test signals, each IC 115 performs a predetermined test, and generates the response signals, which are wirelessly transmitted to the corresponding wireless unit 140; the response signals are sent to the tester 120, which processes them in order to assess whether the ICs 115 integrated on the dies 105 operate properly.

Figure 3:
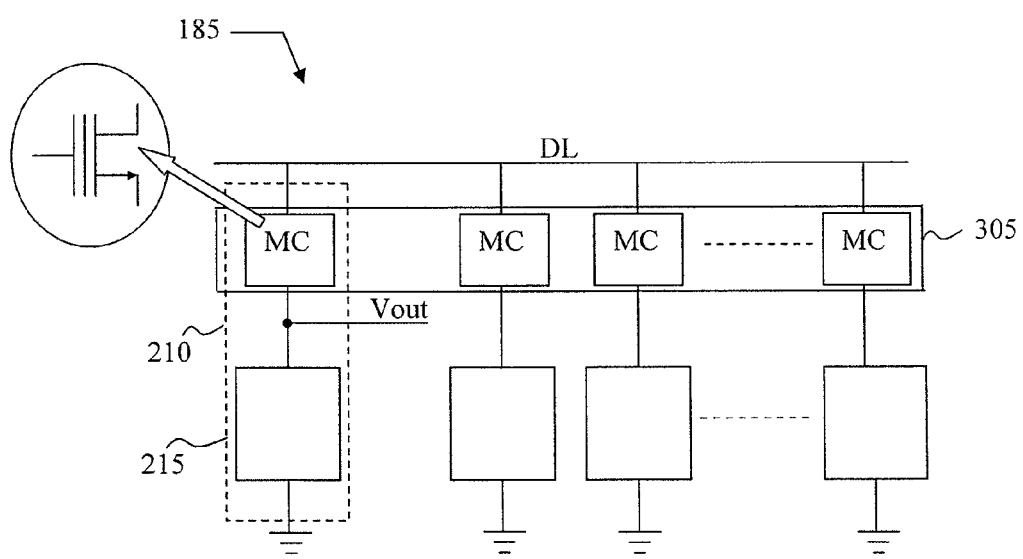
FIG. 3 schematically shows a communication frequency selector, according to another embodiment of the present invention.

Referring to FIG. 3, an implementation of the radio frequency selector 185 according to a second embodiment of the present invention is shown. In this embodiment, the radio frequency selector 185 includes a non-volatile storage area 305. In the example at issue, the non-volatile storage area 305 includes non-volatile memory cells MC (for example, memory cells of the same type used in FLASH memories, formed of floating-gate MOS transistors), which are used instead of the fusible links FL of the first embodiment.

The non-volatile memory cells MC are electrically programmable to store the binary code, corresponding to the desired radio communication frequencies to be used for wirelessly communicating with the die 105. A memory cell MC that is programmed to store a logic "1" has typically a low threshold voltage, so that, when biased for reading its content, it is conductive; the corresponding bit of the binary code is thus a "1"; conversely, a memory cell MC that is programmed to store a logic "0" has a relatively high threshold voltage, so that, when biased for reading its content, it is not conductive; the corresponding bit of the binary code is thus a "0".

The data for programming the memory cells MC may be received from the test equipment wirelessly, using the transceiver circuits 165 and 175.

Figure 4:
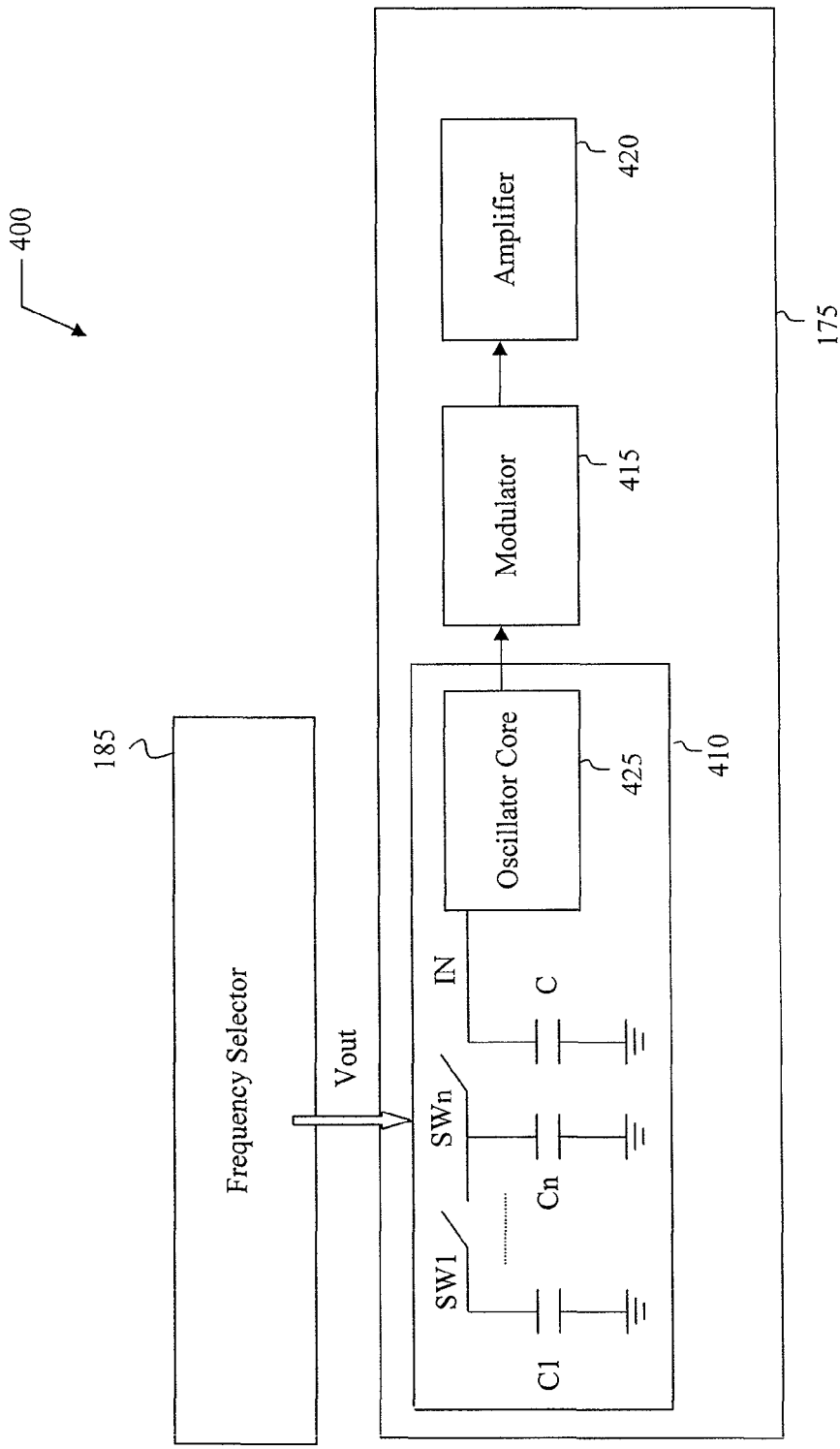
FIG. 4 schematically shows a transceiver circuit adapted to cooperate with a communication frequency selector, for changing the radio communication frequency, according to an embodiment of the present invention.

Referring to FIG. 4, an exemplary scheme of a transceiver circuit 175 adapted to cooperate with the radio frequency selector 185 according to an embodiment of the present invention is shown. As mentioned above, in an embodiment of the present invention the group of output voltages Vout of the different branches of the frequency selector 185 forms a binary code, which is adapted for setting the radio communication frequency of the transceiver circuit 175. For this purpose, the transceiver circuit 175 comprises an oscillator circuit 410 (for example implemented by a Colpits oscillator, a ring oscillator, or the like, the type of oscillator being not limitative) and all the electronic circuits (such as a modulator circuit 415 and an amplifier circuit 420) which, during the test of semiconductor wafer 110, cooperate with the oscillator circuit 410 to decode the test signals.

More in detail, the oscillator circuit 410 comprises an oscillator core 425, which has an input terminal IN connected to a first terminal of a capacitor C having a second terminal connected to ground. The oscillator circuit 410 also comprises a plurality of auxiliary capacitors C1 ... Cn (for example, n=2) each of which is coupled to the input terminal IN of the oscillator core 425 by means of a respective switch SW1 ... SWn. In detail, each auxiliary capacitor Ci has a first terminal, which is connected to a first terminal of the corresponding switch SWi, and a second terminal receiving the ground. Each switch SWi has a second terminal coupled to the input terminal IN of the oscillator core 425. In the example at issue, each switch SWi is enabled by a corresponding one of the groups of output voltages Vout. In other words, when the output voltage Vout is at the supply voltage the first switch SW1 is closed, vice versa when the output voltage Vout is at the ground, the switch SWi is open. In such a way, one or more of the plurality of auxiliary capacitors Ci (for i=0 ... n) can be selectively connected in parallel to the capacitor C by means of the corresponding switches SWi, so that each auxiliary capacitor Ci increases an equivalent capacitance which is connected to the input terminal of the oscillator core 425 (when the corresponding switch SWi is closed).

Depending on the binary code stored in the frequency selector, the radio communication frequency of the generic transceiver circuit 175 is thus accordingly set, since the radio communication frequency depends on the equivalent capacitor which is connected to the input terminal IN of the oscillator core 425.

Alternatively, according to a third embodiment of the present invention, the switches SWi may be directly implemented as fusible links. In such way, the radio communication frequency can be set in each transceiver circuit 175 by selectively burning the fusible links.

In detail, after manufacturing of the wafer 110 the fusible links are conductive so that each capacitor Ci is connected in parallel to the capacitor C. During the programming phase of the radio communication frequency of each transceiver circuit, one or more fusible links can be burned, becoming essentially an open circuit, thereby disconnecting the corresponding capacitor Ci from the capacitor C. In such a way, the equivalent capacitance which is connected to the oscillator core 425 is reduced so setting the desired radio communication frequency.

According to a further embodiment of the present invention, for differentiating the radio communication frequencies of each die 105 of the wafer 110, or of at least of groups of two or more adjacent dies on the wafer, it is possible to deliberately introduce chip-to-chip variations in the pattern of, e.g., metal lines formed in the IC. For example, each transceiver circuit 175, and more in particular each oscillator circuit 410 is designed so that it can wirelessly communicate to the corresponding wireless unit 140 on the wireless probe card 125 with a proper predetermined radio communication frequency. This can be accomplished by modifying (for example, adding contact vias) from chip-to-chip the metal lines connecting the auxiliary capacitors to the capacitor C.

Figure 5:
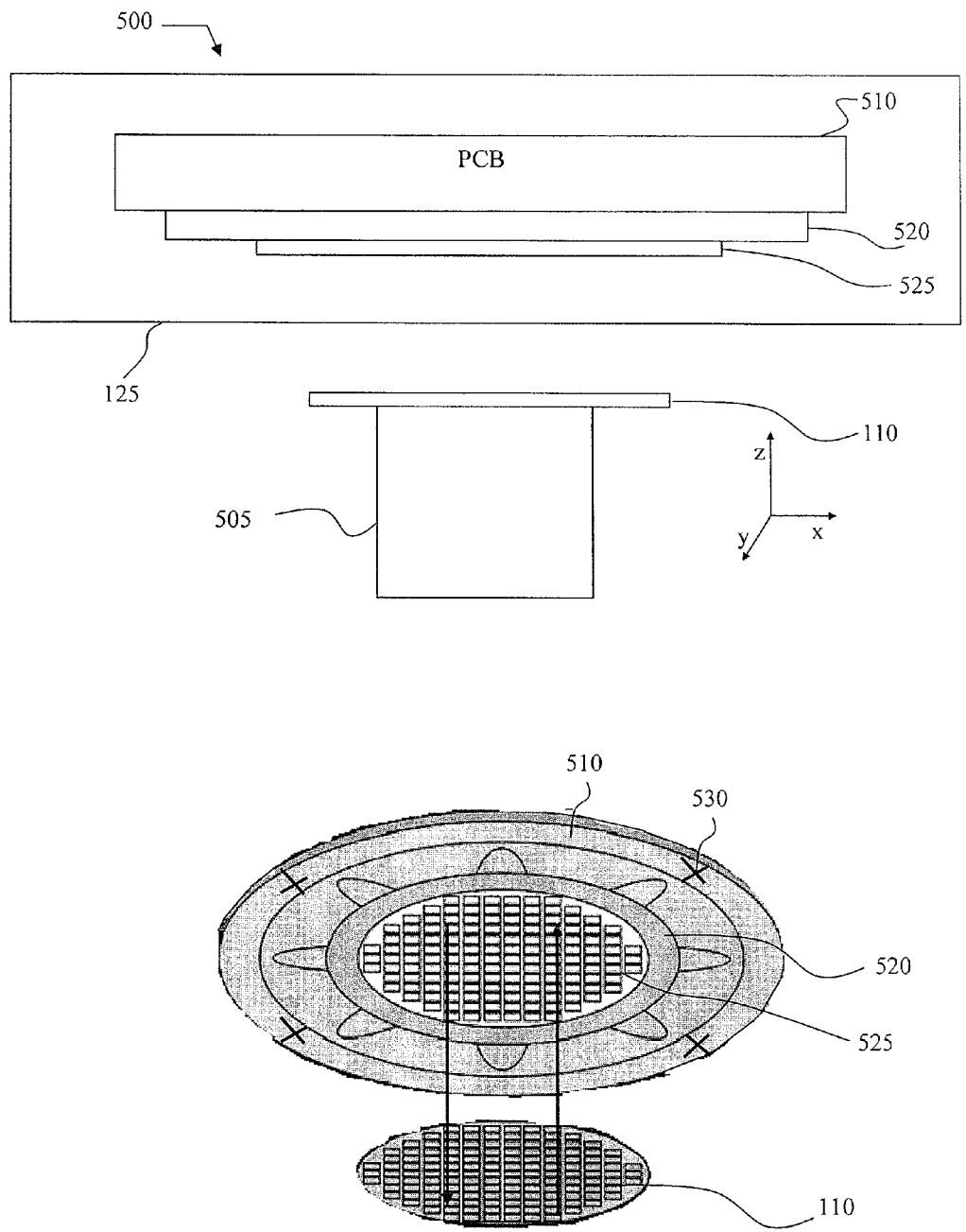
FIG. 5 schematically shows a cross-sectional view of a test equipment wherein the test system according to the present invention is used.

Finally, in FIG. 5 a cross-sectional view of test equipment 500 is schematically shown, in which an exemplary structure and the positioning of the wireless probe card 125 and of the semiconductor wafer 110 to be tested is visible.

The semiconductor wafer 110 is placed on a chuck 505, which is capable of movement in the three orthogonal directions "x", "y" and "z". The chuck 505 may also be rotated and tilted, and it may be further capable of other motions, so that once that the semiconductor wafer 110 is placed on the chuck 505, the latter is moved so that the dies 105 are brought close to the wireless probe card 125, for enabling the wireless communication therewith.

In the example at issue, the wireless probe card 125, in one of its possible embodiment, includes a PCB 510 (for example, comprising the control circuit 130, the storage unit 160 and the tester input/output interface 150) forming a support for a silicon wafer 520 wherein the transceiver circuits 165 are formed. The antennas 170 are embedded in a glass wafer 525, which is placed in contact with the silicon wafer 520 so that the antennas 170 are coupled to the transceiver circuit 165. These antennas 170 (and 180) can be inductors or capacitor plates, or a combination thereof. For example, the antennas 170 (and 180) can be implemented by metal traces having dimensions that can depend on used process technologies and design choices because it's possible to supply power to die 105 using electromagnetic waves or using standard methods.

A top view of the wireless probe card 125 (including the silicon wafer 520 and the glass wafer 525 wherein the transceivers 165 and the antennas 170 are respectively embedded) and the semiconductor wafer 110 is also shown in the drawing.

The antennas 170 are positioned within the glass wafer 525 to form a two-dimensional arrangement which corresponds to the arrangement of dies 105 on the semiconductor wafer 110 under test.

The antennas 170 (and 180) can have same or similar size or different sizes, in agreement with the different used frequencies and design choices.

Fiducial images 530 can be provided on the PCB 510 for allowing the correct alignment between the wireless probe card 125 and the semiconductor wafer 110.

The present invention allows testing at the same time the whole semiconductor wafer 110, or at least of groups of adjacent dies. Indeed, no cross talk phenomena occurs when the test is performed since the radio communication frequencies used to communicate with each die 105 under test are different from the radio communication frequencies used for communicating with the other dies 105 under test, for example adjacent dies.

In this way, a significant reduction of the test time is obtained so causing a productivity improvement, as well.

Moreover, since the test is wirelessly performed and the mechanical probes are (fully or at least in part) eliminated, it is possible to reduce the pad area of the dies so obtaining a significant reduction of the whole area of the die.

In addition, the present invention has the typical advantages of wireless testing, particularly mechanical problems due to the presence of a large number of probes are eliminated by using the wireless communication according to the present invention.

Moreover, the wireless test system according to the present invention is significantly less expensive than those using mechanical probes.

Naturally, in order to satisfy local and specific requirements, a person skilled in the art may apply to the solution described above many modifications and alterations. Particularly, although the present invention has been described with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, although in the preceding description reference has been made to a test system wherein the non volatile storage comprises memory cells of flash type, memory cells of different type (such as EEPROM type) or arranged with a different architecture (for example, of NAND type) can be used.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An apparatus, comprising:
an integrated circuit integrated on a semiconductor material die and adapted to be at least partly tested wirelessly, the integrated circuit comprising circuitry comprising at least one programmable element adapted to store an indication of the radio communication frequency such that the circuitry is configurable, based at least in part on a value programmed in the programmable element, to define a radio communication frequency to be used for wirelessly communicating a radio signal having a test signal modulated thereon to the integrated circuit for a wireless test of the integrated circuit,
wherein the semiconductor material die is a first semiconductor material die formed from a semiconductor material wafer, and wherein the integrated circuit is a first integrated circuit, and wherein the semiconductor material wafer further comprises a second semiconductor material die comprising a second integrated circuit, and wherein the circuitry that is configurable to define a radio communication frequency is adapted to allow defining the radio communication frequency independently of a definition of a radio communication frequency to be used for wirelessly communicating a radio signal having a test signal modulated thereon to the second integrated circuit for a wireless test of the second integrated circuit.

2. The apparatus according to claim 1, wherein the second semiconductor material die comprises a corresponding at least one programmable element, said at least one corresponding programmable element being adapted to store a respective indication of the radio communication frequency to be used for wirelessly communicating the radio signal having the test signal modulated thereon to the second integrated circuit.

3. The apparatus according to claim 1, wherein the at least one programmable element comprises at least one fusible link.

4. The apparatus according to claim 1, wherein the at least one programmable element comprises at least one non-volatile memory cell.

5. The apparatus of claim 1, wherein said circuitry that is configurable to define a radio communication frequency structurally differs from circuitry that is configurable to define the radio communication frequency to be used for wirelessly communicating a radio signal having a test signal modulated thereon to the second integrated circuit.

6. The apparatus of claim 1, further comprising a Colpitts oscillator integrated on the first semiconductor material die and coupled to the integrated circuit.

7. A semiconductor material wafer comprising:
a plurality of semiconductor material dies including a first semiconductor material die and a second semiconductor material die, each of the first and second semiconductor material dies having circuits integrated thereon, and each of the circuits including a programmable element that stores a respective indication of a radio communication frequency to be used for wirelessly communicating a radio signal having a test signal modulated thereon to the circuit, wherein the radio communication frequency for each of the first and second semiconductor material dies is different than radio communication frequencies for other semiconductor material dies of the plurality of semiconductor material dies.

8. The semiconductor material wafer according to claim 7, wherein the programmable element of at least one of the circuits includes one or more fusible links.

9. The semiconductor material wafer according to claim 7, wherein the programmable element of at least one of the circuits includes one or more non-volatile memory cells.

10. A method for wirelessly testing integrated circuits integrated on at least two distinct semiconductor material dies, comprising:
providing a semiconductor wafer that includes a plurality of semiconductor material dies including a first semiconductor material die and a second semiconductor material die, each of the first and second semiconductor material dies having circuits integrated thereon, each of the circuits of the first and second semiconductor material dies including a programmable element configured to store an indication of a radio communication frequency for a respective die; and
programming each of the programmable elements of the circuits of the first and second semiconductor materials dies to store an indication of a radio communication frequency for wirelessly communicating a radio signal having a test signal modulated thereon to the circuit including the programmable element, wherein the radio communication frequency for each of the first and second semiconductor material dies is unique to that die.

11. The method according to claim 10, wherein programming comprises setting fusible links of the programmable elements.

12. The method according to claim 10, wherein programming comprises setting one or more non-volatile memory cells of the programmable elements.

* * * * *

UNITED STATES PATENT AND TRADEMARK OFFICE
CERTIFICATE OF CORRECTION

| | | |
|---|---|---|
| PATENT NO. | : 8,643,395 B2 | Page 1 of 1 |
| APPLICATION NO. | : 13/006942 | |
| DATED | : February 4, 2014 | |
| INVENTOR(S) | : Alberto Pagani | |

It is certified that error appears in the above-identified patent and that said Letters Patent is hereby corrected as shown below:

\*\*In the Specification:

**At column 4, line 24, the word "imitative" should read as follows: --limitative--.\*\***

Signed and Sealed this
Twentieth Day of May, 2014

Michelle K. Lee
*Deputy Director of the United States Patent and Trademark Office*